(12) United States Patent
Ivanov

(10) Patent No.: US 8,284,581 B2
(45) Date of Patent: Oct. 9, 2012

(54) ACTIVE RECTIFIER AND METHOD FOR ENERGY HARVESTING POWER MANAGEMENT CIRCUIT

(75) Inventor: Vadim V. Ivanov, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 497 days.

(21) Appl. No.: 12/653,005

(22) Filed: Dec. 7, 2009

(65) Prior Publication Data

US 2011/0134674 A1    Jun. 9, 2011

(51) Int. Cl.
*H02M 7/217*    (2006.01)
(52) U.S. Cl. ....................................... 363/127
(58) Field of Classification Search ............ 363/50, 363/52, 53, 125, 127, 147
See application file for complete search history.

(56) References Cited

U.S. PATENT DOCUMENTS

| | | | | |
|---|---|---|---|---|
| 6,972,619 B2 * | 12/2005 | Sato et al. | .......... | 330/86 |
| 7,898,332 B2 * | 3/2011 | Deguchi et al. | ............... | 330/259 |
| 2011/0227543 A1 * | 9/2011 | Ivanov | ........................ | 320/163 |

OTHER PUBLICATIONS

"Fully Integrated Wideband High-Current Rectifiers for Inductively Powered Devices" by Maysam Ghovanloo and Khalil Najafi, IEEE Journal of Solid-State Circuits, vol. 39, No. 11, Nov. 2004, pp. 1976-1984.

"A High Efficiency Full-Wave Rectifier in Standard CMOS Technology", by Gaurav Bawa and Maysam Ghovanloo, IEEE 2007, pp. 81-84.

"A Full-Wave Rectifier for Interfacing with Multi-Phase Piezoelectric Energy Harvesters" by Guilar et al., 2008 IEEE International Solid-State Circuits Conference, pp. 302, 303 and 615.

* cited by examiner

*Primary Examiner* — Matthew Nguyen
(74) *Attorney, Agent, or Firm* — William B. Kempler; Wade J. Brady, III; Frederick J. Telecky, Jr.

(57) ABSTRACT

An active rectifier (12) couples a first input voltage (Vin1) to a first electrode of a first transistor (M3) having a second electrode coupled to an output (4) conducting an output voltage (Vout), and couples a second input voltage (Vin2) to a first electrode of a second transistor (M4) having a second electrode coupled to the output conductor. A first amplifier (A1) controls a voltage (V16) of a gate of the first transistor to maintain an input offset of the first amplifier between the first input voltage and the output voltage while the first input voltage exceeds the output voltage, and a second amplifier (A2) controls a voltage (V15) on a gate of the second transistor to maintain an input offset between the second input voltage and the output voltage while the first input voltage exceeds the output voltage. The input offsets prevent backflow of current from the output to either of the first electrodes when the first or second input is nearly equal to the output voltage.

20 Claims, 6 Drawing Sheets

ACTIVE RECTIFIER AND METHOD FOR ENERGY HARVESTING POWER MANAGEMENT CIRCUIT

BACKGROUND OF THE INVENTION

The present invention relates generally to low power rectifiers, especially to rectifiers suitable for "micro-harvesting" very low levels of low voltage, low frequency AC power. The invention relates more particularly to active rectifiers that can effectively rectify harvested low voltage AC power by reducing voltage drop and power loss across switches of the active rectifier circuits.

Engineers have attempted to design very low power integrated circuits, for example integrated circuits that require extremely low amounts of operating current and which can be operated without being plugged into conventional AC power systems. Instead, it is desirable that such ultra-low-power integrated circuits be powered by small amounts of power "scavenged" from ambient solar, vibrational, thermal, and/or biological energy sources by means of micro-energy harvesting devices and stored in batteries or super-capacitors (since such ambient power sources often are capable only of supplying small amounts of intermittent, unregulated power).

Prior Art FIG. 1 shows a conventional CMOS passive rectifier 1. An AC input voltage Vin1-Vin2 is applied between input conductors 2 and 3. The sources of P-channel transistors M6 and M7 are connected to Vin1 conductor 2 and the sources of P-channel transistors M3 and M4 are connected to Vin2 conductor 3. The drain of transistor M7 is connected to the source of P-channel transistor M8, the gate of which is connected to Vin1. The drain of transistor M4 is connected to the source of P-channel transistor M5, the gate of which is connected to Vin2. The drains of transistors M6, M8, M5 and M3 are connected to conductor 4 on which the rectified output signal Vout is generated. The gates of transistors M6, M7, M4, and M3 are connected to Vout conductor 4. The back or bulk electrodes of transistors M6, M7, and M8 are connected together, and the back or bulk electrodes of transistors M3, M4, and M5 also are connected together.

Vin1 conductor 2 is also connected to the gate of N-channel transistor M2 and the drain of N-channel transistor M1. Conductor 3 is connected to the gate of N-channel transistor M1 and the drain of N-channel transistor M2. Diode-connected transistors M6 and M3 operate to couple the one of Vin1 conductor 2 and Vin2 conductor 3 which is at the lower voltage to ground while the other one supplies rectified current through transistor M6 or M3 to Vout conductor 4.

The voltage drop between either (1) input voltage Vin1 and output voltage Vout or (2) between input voltage Vin2 and output voltage Vout is typically about 500 to 700 millivolts. This large voltage drop greatly decreases the efficiency of conventional rectifier 1 for applications with low input voltage sources. The large voltage drop also makes passive rectifier 1 impractical for rectifying low voltage signals under about 400 millivolts, for example low voltage signals generated by energy harvesting devices such as thermopiles, solar cells, and inductive vibration sensors.

Prior Art FIG. 2 shows a generalized diagram of a conventional high-efficiency full wave "active" rectifier 5, which typically is implemented in standard CMOS technology. Rectifier 5 includes a P-channel switching transistor P1 having a source connected to conductor 2 on which input voltage Vin1 is received, and also includes a P-channel switching transistor P2 having a drain connected to conductor 3 on which an input voltage Vin2 is received. (Note that the source of a P-channel transistor is the one of its two current-carrying electrodes which is at the highest voltage. The other current-carrying electrode of the transistor is its drain. The functions of the two current-carrying electrodes therefore are interchangeable during circuit operation. Note also that transistors P1 and P2 could be replaced by N-channel transistors, in which case the (+) and (−) inputs of each of comparators 7 and 8 would be reversed.) A harvested AC input signal Vin1-Vin2 is applied between input conductors 2 and 3. The drain of switching transistor P1 and the source of switching transistor P2 as shown in FIG. 2 are connected to an output conductor 4 on which the rectified output voltage Vout is produced. A load capacitance CL and a load resistance RL are coupled in parallel between Vout and ground. The gate of switching transistor P1 is connected to the output of a hysteresis comparator 7 having its (+) input connected to Vout and its (−) input coupled to Vin1 conductor 2. The gate of transistor P2 is connected to the output of a hysteresis comparator 8 having its (+) input connected to Vout and its (−) input is coupled to conductor 3. A N-channel transistor M1 has its source connected to ground, its drain connected to conductor 2, and its gate connected to conductor 3. A N-channel transistor M2 has its source connected to ground, its drain connected to Vin2 conductor 2, and its gate connected to Vin1 conductor 3.

Active rectifier 5 of Prior Art FIG. 2 requires high speed, low offset precision comparators 7 and 8 in combination with switching transistors P1 and P2 in order to perform the necessary switching operations. The use of the hysteresis comparators in Prior Art FIG. 2 keeps transistor P1 (or transistor P2) turned on hard, and the active drain-source voltage of turned on transistor P1 (or transistor P2) falls rapidly to zero at the instant when it is necessary to very quickly discharge the gate of transistor P1 (or transistor P2) from a very high voltage to a very low voltage. That increases the amount of current consumed by the comparators because their speed is approximately proportional to their consumption of current and therefore results in high current and power consumption of active rectifier 5. This means comparators 7 and 8 of FIG. 2 must be relatively large, complex, high power circuits, the size, complexity, and power requirements of which increase even further if the active rectifiers must be able to rectify both large input voltages (above about 1 to 2 volts) and small input voltages (below about 20 to 100 millivolts).

Consequently, the active rectifier of FIG. 2 necessarily consumes far too much power to be practical for use in rectifying very low power signals.

Thus, there is an unmet need for a very low power active rectifier circuit and method capable of efficiently rectifying very low power signals.

There also is an unmet need for a very low power active rectifier circuit and method capable of efficiently rectifying very low power signals having voltage levels of less than approximately 400 millivolts.

There also is an unmet need for a very low power active rectifier circuit and method capable of efficiently rectifying both very low voltage, low power signals and relatively high voltage signals.

SUMMARY OF THE INVENTION

It is an object of the invention to provide a very low power active rectifier circuit and method capable of efficiently rectifying very low power signals.

It is another object of the invention to provide a very low power active rectifier circuit and method capable of efficiently rectifying very low power signals having voltage levels of less than approximately 400 millivolts.

It is another object of the invention to provide a very low power active rectifier circuit and method capable of efficiently rectifying very low power signals having voltage levels of less than approximately 400 millivolts and requiring a current consumption of only a few nanoamperes.

It is another object of the invention to provide a very low power active rectifier circuit and method capable of efficiently rectifying both very low power harvested signals and relatively high voltage harvested signals.

Briefly described, and in accordance with one embodiment, the present invention provides an active rectifier (12) that couples a first input voltage (Vin1) to a first electrode of a first transistor (M3) having a second electrode coupled to an output (4) conducting an output voltage (Vout), and couples a second input voltage (Vin2) to a first electrode of a second transistor (M4) having a second electrode coupled to the output conductor. A first amplifier (A1) controls a voltage (V16) of a gate of the first transistor to maintain an input offset voltage of the first amplifier between the first input voltage and the output voltage while the first input voltage exceeds the output voltage, and a second amplifier (A2) controls a voltage (V15) on a gate of the second transistor to maintain an input offset voltage between the second input voltage and the output voltage while the first input voltage exceeds the output voltage. The input offset voltages prevent backflow of current from the output to either of the first electrodes when the first or second input voltage is nearly equal to the output voltage.

In one embodiment, the invention provides an active rectifier circuit (12) including a first transistor (M3) having a first current-carrying electrode coupled by a first input conductor (2) to a first input voltage (Vin1) and a second current-carrying electrode coupled to an output conductor (4) for conducting a rectified output voltage (Vout), and a second transistor (M4) having a first current-carrying electrode coupled by a second input conductor (3) to a second input voltage (Vin2) and a second current-carrying electrode coupled to the output conductor (4). A first amplifier (A1) has a first input (+) coupled to the first input conductor (2), a second input (−) coupled to the output conductor (4), and an output (V16) coupled to a gate of the first transistor (M3), and a second amplifier (A2) has a first input (+) coupled to the second input conductor (3), a second input (−) coupled to the output conductor (4), and an output (V15) coupled to a gate of the second transistor (M4). A third transistor (M1) has a first current-carrying electrode coupled to a first reference voltage (GND), a second current-carrying electrode coupled to the first input conductor (2), and a gate coupled to the output (V15) of the second amplifier (A2), and a fourth transistor (M2) has a first current-carrying electrode coupled to the first reference voltage (GND), a second current-carrying electrode coupled to the second input conductor (3), and a gate coupled to the output (V16) of the first amplifier (A1). The first (A1) and second (A2) amplifiers each have an input offset voltage that prevents backflow of current from the output conductor (4) to either of the first (2) and second (3) input conductors when either of the first (Vin1) and second (Vin2) input voltages, respectively, is nearly equal to the output voltage (Vout). In a described embodiment, the input offset voltage of each of the first (A1) and second (A2) amplifiers has a magnitude of approximately +5 to +10 millivolts to cause the first (Vin1) and/or second (Vin2) input voltage to exceed the output voltage (Vout) during operation of the active rectifier circuit. The first amplifier (A1) operates to maintain a difference between the first input voltage (Vin1) and the output voltage (Vout) equal to the input offset voltage of the first amplifier (A1). The second amplifier (A2) operates to maintain a difference between the second input voltage (Vin2) and the output voltage (Vout) equal to the input offset voltage of the second amplifier (A2). In a described embodiment, the first (Vin1) and second (Vin2) input voltages are AC voltages and each can have an amplitude as low as approximately 200 millivolts. In a described embodiment, the input offset voltages are internal built-in non-negative input offset voltages of the first (A1) and second (A2) amplifiers, respectively.

In a described embodiment, the first amplifier (A1) includes first (MN15) and second (MN14) input transistors having sources coupled to the first input conductor (2) and the output conductor (4), respectively, drains coupled to corresponding current sources (25-,24-), respectively, and gates connected to the drain of the second input transistor (MN14), and the second amplifier (A2) includes third (MN21) and fourth (MN20) input transistors having sources coupled to the second input conductor (3) and the output conductor (4), respectively, drains coupled to corresponding current sources (23-,24-), respectively, and gates connected to the drain of the fourth input transistor (MN20).

In a described embodiment, the active rectifier circuit includes first (26-1) and second (26-2) passive rectifier circuits for rectifying the first (Vin1) and second (Vin2) input voltages, respectively, under low supply voltage conditions wherein the first (A1) and second (A2) amplifiers are inoperable.

In a described embodiment, the active rectifier circuit includes a fifth transistor (M5) having a first current-carrying electrode coupled to the first input conductor (2) and a second current-carrying electrode coupled to the output conductor (4), and a sixth transistor (M6) having a first current-carrying electrode coupled to the second input conductor (3) and a second current-carrying electrode coupled to the output conductor (4). A third amplifier (A3) has a first input (+) coupled to the output conductor (4), a second input (−) coupled to the first input conductor (2), and an output coupled to a gate of the fifth transistor (M5), and a fourth amplifier (A4) has a first input (+) coupled to the output conductor (4), a second input (−) coupled to the second input conductor (3), and an output coupled to a gate of the sixth transistor (M6).

In one embodiment, the invention provides a method for rectifying a low voltage AC input signal that is equal to a first input voltage (Vin1) minus a second input voltage (Vin2) to produce a rectified output voltage (Vout), including coupling the first input voltage (Vin1) to a first current-carrying electrode of a first transistor (M3) having a second current-carrying electrode coupled to an output conductor (4) for conducting the rectified output voltage (Vout), and coupling the second input voltage (Vin2) to a first current-carrying electrode of a second transistor (M4) having a second current-carrying electrode coupled to the output conductor (4); controlling a first voltage (V16) on a gate of the first transistor (M3) by means of a first amplifier (A1) to maintain a predetermined offset voltage of the first amplifier (A1) between the first input voltage (Vin1) and the rectified output voltage (Vout) while the first input voltage (Vin1) exceeds the rectified output voltage (Vout), and controlling a second voltage (V15) on a gate of the second transistor (M4) by means of a second amplifier (A2) to maintain a predetermined offset voltage of the second amplifier (A2) between the second input voltage (Vin2) and the rectified output voltage (Vout) while the first input voltage (Vin2) exceeds the rectified output voltage (Vout); the predetermined offset voltages preventing backflow of current from either of the second current-carrying electrodes to either of the first current-carrying electrodes when either of the first (Vin1) and second (Vin2) input voltages, respectively, is nearly equal to the rectified output voltage (Vout).

In one embodiment, the method includes coupling a first current-carrying electrode of a third transistor (M1) to a first reference voltage (GND), coupling a second current-carrying electrode of the third transistor (M1) to the first current-carrying electrode of the first transistor (M3), and coupling a gate of the third transistor (M1) to the gate of the second transistor (M4), and coupling a first current-carrying electrode of a fourth transistor (M2) to the first reference voltage (GND), coupling a second current-carrying electrode of the fourth transistor (M2) to the first current-carrying electrode of the second transistor (M4), and coupling a gate of the fourth transistor (M2) to the gate of the first transistor (M3). In one embodiment, the input offset voltages of the first (A1) and second (A2) amplifiers are equal to approximately +5 to +10 millivolts. The method includes operating the first amplifier (A1) to maintain a difference between the first input voltage (Vin1) and the output voltage (Vout) equal to the input offset voltage of the first amplifier (A1), and operating the second amplifier (A2) to maintain a difference between the second input voltage (Vin2) and the output voltage (Vout) equal to the input offset voltage of the second amplifier (A2).

In one embodiment, the method includes operating first (26-1) and second (26-2) passive rectifier circuits to rectify the first (Vin1) and second (Vin2) input voltages, respectively, under low supply voltage conditions wherein the first (A1) and second (A2) amplifiers are inoperable.

In one embodiment, the method provides an active rectifier (12) for rectifying a low voltage AC input signal that is equal to a first input voltage (Vin1) minus a second input voltage (Vin2) to produce a rectified output voltage (Vout), including means (2) for coupling the first input voltage (Vin1) to a first current-carrying electrode of a first transistor (M3) having a second current-carrying electrode coupled to an output conductor (4) for conducting the rectified output voltage (Vout), and means (3) for coupling the second input voltage (Vin2) to a first current-carrying electrode of a second transistor (M4) having a second current-carrying electrode coupled to the output conductor (4); first amplifier means (A1) for controlling a first voltage (V16) on a gate of the first transistor (M3) to maintain a predetermined offset voltage of the first amplifier (A1) between the first input voltage (Vin1) and the rectified output voltage (Vout) while the first input voltage (Vin1) exceeds the rectified output voltage (Vout), and second amplifier means (A2) for controlling a second voltage (V15) on a gate of the second transistor (M4) to maintain a predetermined offset voltage of the second amplifier (A2) between the second input voltage (Vin2) and the rectified output voltage (Vout) while the first input voltage (Vin2) exceeds the rectified output voltage (Vout); and the predetermined offset voltages preventing backflow of current from either of the second current-carrying electrodes to either of the first current-carrying electrodes when either of the first (Vin1) and second (Vin2) input voltages, respectively, is nearly equal to the rectified output voltage (Vout).

DETAILED DESCRIPTION OF THE PREFERRED EMBODIMENTS

When energy is to be micro-harvested or scavenged from very low voltage, low-frequency power signal sources such as ambient solar, vibrational, or thermal power sources, it is highly desirable to be able to rectify the low voltage, low-frequency signals much more efficiently than has been achievable in the prior art.

Figure 3A:
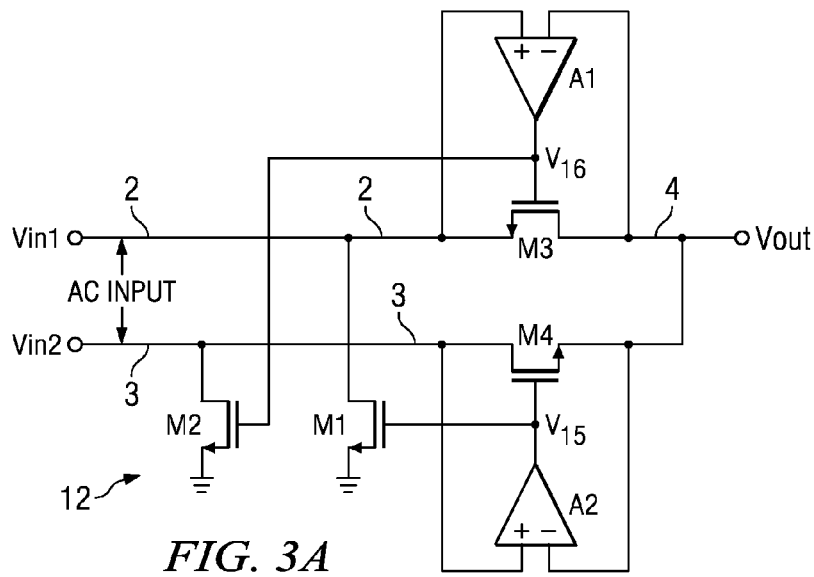
FIG. 3A is a generalized schematic drawing of an active rectifier utilizing low-offset feedback amplifiers.

To this end, FIG. 3A shows a generalized diagram of a full wave active rectifier 12 which can be implemented in standard CMOS technology as shown in subsequently described FIG. 3B. Rectifier 12 includes a N-channel switching transistor M3 having a source (or drain) connected to conductor 2 on which an input voltage Vin1 is received, and also includes a N-channel switching transistor M4 having a drain (or source) connected to conductor 3 on which an input voltage Vin2 is received. A harvested AC input signal Vin1-Vin2 can be applied between conductors 2 and 3. The input signals Vin1 and Vin2 can come, for example, from a piezo harvester or an induction harvester.

The drain of transistor M3 and the source of transistor M4 as shown in FIG. 3A are connected to output conductor 4, on which the rectified output voltage Vout is produced. A load capacitance CL and a load resistance RL (as shown in Prior Art FIG. 2) can be coupled in parallel between Vout and ground or $V_{SS}$. The gate of transistor M3 is connected to the output of a feedback amplifier A1 having its (−) input connected to Vout and its (+) input coupled to conductor 2. The gate of transistor M4 is connected to the output of another feedback amplifier A2 having its (−) input connected to Vout and its (+) input coupled to conductor 3.

A N-channel transistor M1 has its drain connected to conductor 2, its source connected to ground or $V_{SS}$, and its gate connected to the output of feedback amplifier A2. A N-channel transistor M2 has its drain connected to conductor 3, its source connected to ground or $V_{SS}$, and its gate connected the output of feedback amplifier A1. Each of amplifiers A1 and A2 has a small built-in input non-negative offset voltage, which in this example is approximately 5 to 10 millivolts so that amplifier A1 maintains Vin1 at 5 to 10 millivolts above Vout and/or amplifier A2 maintains Vin2 at 5 to 10 millivolts above Vout, so that there is no backflow of current from Vout conductor 4 to Vin1 conductor 2 and/or Vin2 conductor 3. Transistors M3 and M4 function as voltage follower output transistors. Amplifier A1 and transistor M3 function as a "feedback follower" circuit to produce the rectified voltage Vout while Vin1 is high, and similarly, amplifier A2 and transistor M4 function as a feedback follower circuit to produce the rectified voltage Vout on conductor 4 when Vin2 is high.

It should be appreciated that the above mentioned built-in offset voltage preferably is greater than or equal to zero. However, it also should be appreciated that the active rectifier circuit is operational even if the offset voltage is less than zero. However, its power efficiency will be reduced somewhat due to current backflow from Vout to Vin1 or Vin2.

Figure 1:
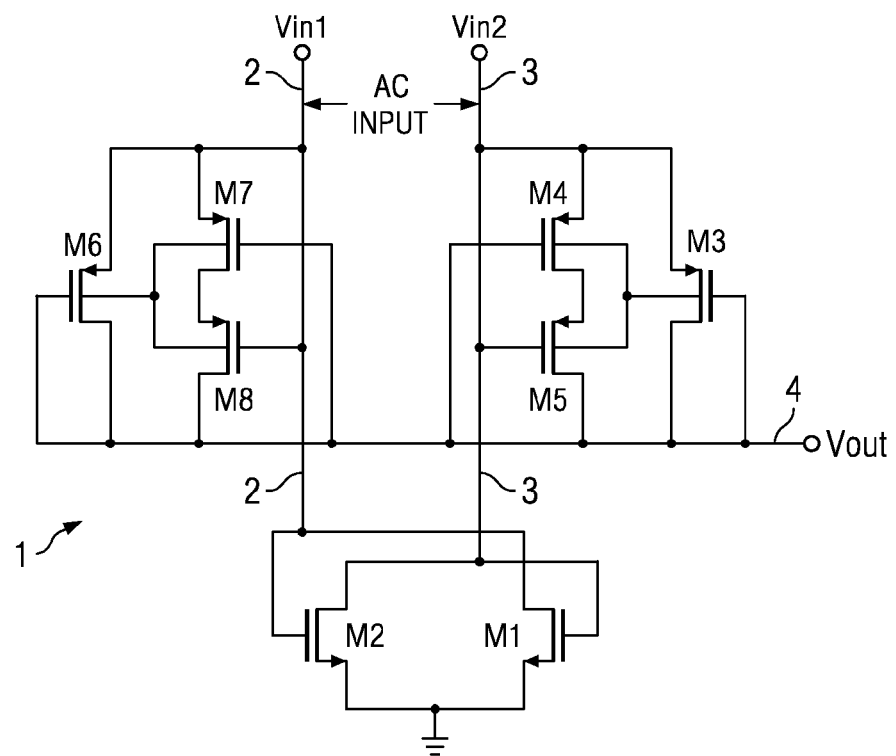
FIG. 1 is a schematic diagram of a conventional passive high-current rectifier.
Figure 2:
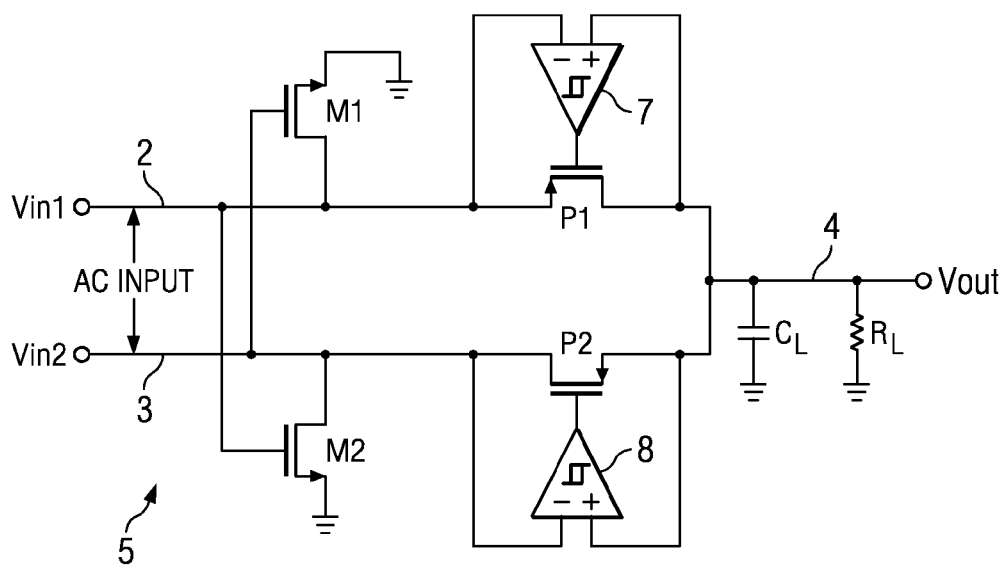
FIG. 2 is a generalized diagram of a prior art high-efficiency active full wave rectifier.

Active rectifier 12 of FIG. 3A differs from active rectifier 5 of Prior Art FIG. 2 by using the foregoing feedback follower circuits instead of using hysteresis comparators 7 and 8 in combination with switching transistors P1 and P2. Active rectifier 12 also differs from active rectifier 5 of Prior Art FIG. 2 by connecting the outputs of amplifiers A1 and A2 to the gates of transistors M2 and M1, respectively. These differences can improve the power consumption of active rectifier 12 for a low voltage harvested AC input signal by a factor of as much as roughly 100 compared to the power consumption of prior art rectifier circuit 5 (FIG. 2) with the same transistor switch sizes and receiving the same AC input signal.

Active rectifier 12 as shown in FIG. 3A operates as follows. When the values of Vin1 and Vin2 are small, feedback amplifiers A1 and A2 keep transistors M3 and M4 off so that no current flows between output conductor 4 and either of input conductors 2 and 3. When Vin1 starts to increase and Vin2 correspondingly starts to decrease, transistor M2 turns on and couples the lower voltage input conductor 3 to ground. In this case, when Vin1 exceeds Vout, that causes the output of feedback amplifier A1 to turn transistor M3 on and maintain the difference between input voltage Vin1 and output voltage Vout equal to the approximately +10 millivolt input offset voltage of amplifier A1. (Note that the source of N-channel transistor M3 is the one of its current-carrying electrodes which is at a voltage lower than the other one, and in this example is connected to Vout. Note also that the (+) polarity of the built-in input offset voltage of amplifier A1 is important because a −10 millivolt offset in this case would allow current backflow from Vout to Vin1)

Similarly, when Vin2 starts to increase and Vin1 correspondingly starts to decrease, transistor M1 is turned on and couples the lower voltage input conductor 2 to ground. In this case, when Vin2 exceeds Vout, that causes the output of feedback amplifier A2 to turn transistor M4 on and maintain the difference between input voltage Vin2 and output voltage Vout equal to the approximately +10 millivolt input offset voltage of amplifier A2. (Note that the source of N-channel transistor M4 is the one of its current-carrying electrodes which is at the lowest voltage, and in this example is connected to Vout.)

The non-negative (i.e., greater than or equal to zero) built-in input offset voltages of amplifiers A1 and A2 prevent any current backflow from Vout to either of input conductors 2 and 3 when one of Vin1 or Vin2 is nearly equal to Vout but does not exceed it.

Figure 4:
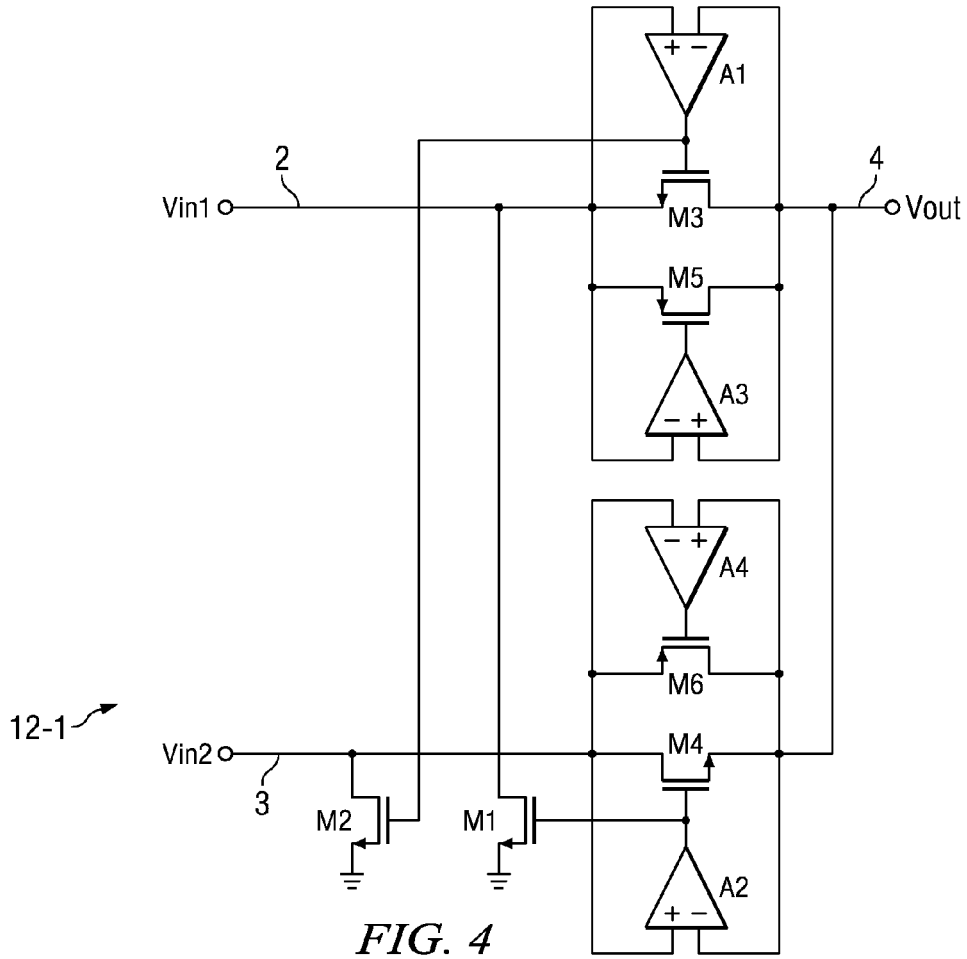
FIG. 4 is a generalized diagram of another implementation of the active rectifier of FIG. 3A.

FIG. 4 shows another active rectifier 12-1 which is essentially the same as active rectifier 12 of FIG. 3A except that it has been modified to allow a wide input voltage range. The modifications included in FIG. 4 include P-channel transistors M5 and M6 and feedback amplifiers A3 and A4. Transistor M5 is connected between conductors 2 and 4, and its gate is connected to the output of feedback amplifier A3. The (+) and (−) inputs of amplifier A3 are connected to conductors 4 and 2, respectively. Transistor M6 is connected between conductors 2 and 4, and its gate is connected to the output of feedback amplifier A4. The (+) and (−) inputs of amplifier A4 are connected to conductors 4 and 3, respectively. This active rectifier circuit can rectify AC signals having values in the range from a very low voltage to a high voltage.

Figure 3B:
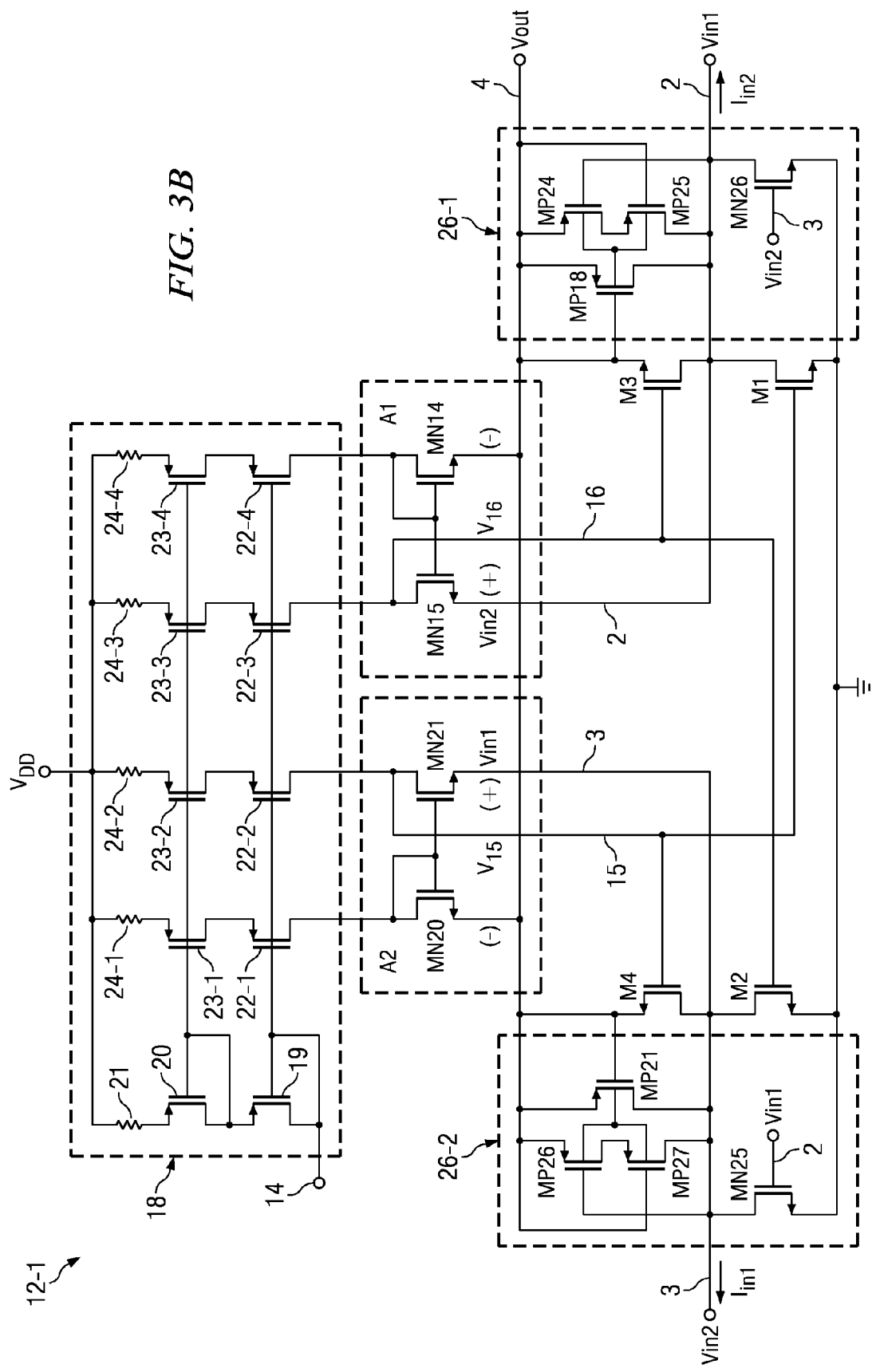
FIG. 3B is a detailed schematic diagram of a practical implementation of the active rectifier shown in FIG. 3A.

FIG. 3B shows a CMOS implementation 12-1 of active rectifier 12 in FIG. 3A. Transistors M1, M2, M3, and M4 in FIG. 3B are connected as shown in FIG. 3A. Amplifier A1 in FIG. 3A is implemented in FIG. 3B by means of transistors MN15 and MN14. Amplifier A2 is implemented by means of transistors MN20 and MN21. The channel widths of differentially coupled amplifier transistors M20 and M21 are mismatched so as to create the previously mentioned built-in input offset voltage of about +10 millivolts in amplifier A2, and the channel widths of differentially coupled amplifier transistors M14 and M15 are similarly mismatched to generate the built-in +10 millivolt input offset voltage for amplifier A1. (The input offset voltages also can be provided by using mismatched current sources or by using appropriate resistors.)

In FIG. 3B, Vin2 conductor 3 is connected to the drains of P-channel transistors MP27, MP21 and M4 and also to the source of N-channel transistor MN21. The gate of transistor MP27 is connected to Vout conductor 4. The source of transistor MP27 is connected to the drain of P-channel transistor MP26, the source of which is connected to Vout conductor 4. The bulk electrodes of transistors MP21, MP26, and MP27 are connected together. The gate of transistor MP26 is connected to Vin2 conductor 3. The source and gate of transistor MP21 and the source of transistor M4 are connected to Vout conductor 4. Although the gate and the source of transistor MP21 as shown in FIG. 3B appear to be connected together, it can function as a diode-connected transistor when its electrode connected to Vin2 conductor 3 is at a higher voltage than Vout and therefore functions as its source. The gate of transistor M3 is connected by conductor 15 to the drain of transistor MN21. Vin2 conductor 3 also is connected to the drains of N-channel transistors MN25 and M2. The gate of transistor M25 is coupled to Vin1. The sources of transistors MN25 and M2 are connected to ground.

Similarly, Vin1 conductor 2 is connected to the drains of P-channel transistors MP25, MP18 and M3 and also to the source of N-channel transistor MN15. The gate of transistor MP25 is connected to Vout conductor 4. The source of transistor MP25 is connected to the drain of P-channel transistor MP24, the source of which is connected to Vout conductor 4. The bulk electrodes of transistors MP18, MP24, and MP25 are connected together. The gate of transistor MP24 is connected to Vin1 conductor 2. The source and gate of transistor MP18 and the source of transistor M3 are connected to Vout conductor 4. The gate of transistor M3 is connected by conductor 16 to the drain of transistor MN15. Vin1 conductor 2 also is connected to the drains of N-channel transistors MN26 and M1. The gate of transistor MP24 is coupled to Vin1. The sources of transistors MN26 and M1 are connected to ground. The gate of transistor M1 is connected to conductor 15, and the gate of transistor M2 is connected to conductor 16.

The gate of transistor MN21 is connected to the gate and drain of N-channel transistor MN20, the source of which is connected to Vout conductor 4. The gate of transistor MN15 is connected to the gate and drain of N-channel transistor MN14, the source of which is connected to Vout conductor 4.

The drains of transistors MN20 and MN21 of amplifier A2 and the drains of transistors MN15 and MN14 of amplifier A1 are connected to the drains of P-channel cascode transistors 22-1,2,3,4, respectively, of conventional current source circuitry 18. The gates of transistors 22-1,2,3,4 are connected to the gate and drain of a diode-connected P-channel transistor 19 by means of a conductor 14 which receives a bias current control signal. The sources of transistors 22-1,2,3,4 are connected to the drains of P-channel current mirror output transistors 23-1,2,3,4, respectively. The sources of current mirror output transistors 23-1,2,3,4 are coupled to $V_{DD}$ by resistors 24-1,2,3,4, respectively. The gates of current mirror output transistors 23-1,2,3,4 are connected to the gate and drain of a P-channel current mirror input transistor 20, the gate and drain of which are also connected to the source of transistor 19. The source of transistor 20 is coupled to $V_{DD}$ by means of resistor 21.

Active rectifier 12-1 in FIG. 3B includes not only active rectifier circuitry based on current-input amplifiers A1 and A2 which receive input currents $I_{in1}$ and $I_{in2}$, respectively, but also includes two basic conventional passive rectifier circuits 26-1 and 26-2 which function in case a sufficiently high value of supply voltage $V_{DD}$ is not presently available to allow amplifiers A1 and A2 to operate properly. Passive rectifier circuit 26-2 includes P-channel transistors MP21, MP26, and MP27 and N-channel transistor M25. Passive rectifier circuit 26-1 includes P-channel transistors MP18, MP24, and MP25 and N-channel transistor M22. If no battery is present, the passive rectifier is necessary to provide a "cold start" of the active rectifier circuitry.

If input voltages Vin1 and Vin2 are increased to levels above 1-2 volts and become comparable to the value of $V_{DD}$, then N-channel switching transistor M3 in FIG. 3A (also M3 in FIG. 3B) needs to be augmented by coupling P-channel switching transistor M5 of FIG. 3A in parallel with M3 and by controlling transistor M5 with amplifier A3 in the same way shown in FIG. 4. (A typical value of $V_{DD}$ which supplies operating power to amplifiers A1 and A2 in FIGS. 3A and 3B is from approximately 3 volts to approximately 5 volts.) In that case, N-channel switching transistor M4 in FIG. 4 also needs to be augmented by coupling P-channel switching transistor M6 of FIG. 4 in parallel with M4 and by controlling transistor M6 with amplifier A4 of FIG. 4. However, FIG. 3B shows a complementary CMOS implementation wherein Vin1 and Vin2 each can go either to high or low input voltage levels.

In FIG. 3B, when Vin1 increases to a value slightly greater than Vout (and Vin1 and therefore decreases to a value slightly below Vout), then transistor M3 turns on in response to the output V16 of amplifier A1 (i.e., transistors MN14 and MN15) and couples Vin1 directly to Vout. Also, transistor M2 is turned on in response to V16 and effectively short-circuits Vin2 to ground. Feedback amplifier A1 also operates so as to maintain an approximately 10 millivolt input offset voltage difference between Vin1 and Vout until the next phase change in the cycle of the harvested AC input signal Vin1-Vin2. The output V16 of feedback amplifier A1 increases either until it reaches $V_{DD}$ or as long as amplifier A1 can maintain the built-in input offset drain-source voltage drop of 10 millivolts between Vin1 and Vout.

When the harvested AC input signal changes phase and Vin1 begins to decrease below Vout, then the signal V16 applied to the gate of transistor M3 decreases to ground so both of transistors M2 and M3 are turned off. At the instant at which Vin2 increases above Vout, essentially the same foregoing operation is repeated for the new phase of the harvested AC input signal. That is, when Vin2 increases to a value slightly greater than Vout (and Vin1 therefore decreases to a value slightly below Vout), then transistor M4 turns on in response to the output V15 of amplifier A2 (i.e., transistors MN20 and MN21) and couples Vin2 directly to Vout. Also, transistor M1 is turned on in response to V15 and effectively short-circuits Vin1 to ground. Feedback amplifier A2 also operates so as to maintain the approximately 10 millivolt input offset voltage difference between Vin2 and Vout until the next phase change in the harvested AC input signal cycle. The output V15 of feedback amplifier A2 increases either until it reaches $V_{DD}$ or as long as amplifier A2 can maintain the built-in input offset drain-source voltage drop of 10 millivolts between Vin2 and Vout.

The harvested output (i.e., Vin1 or Vin2) is sinusoidal, and when its current magnitude is very large, then the gate of transistor M4 (or of transistor M3) may increase all the way to $V_{DD}$. However, as the input current magnitude decreases to lower and lower values, much less gate-to-source drive voltage is needed across transistor M4 (or transistor M3), so feedback amplifier A2 (or A1) output voltage V15 (or V16) on its gate keeps getting smaller. Then when the current $I_{in1}$ (or $I_{in2}$) goes to zero, it is necessary to very quickly turn off transistor M4 or M3 to avoid current backflow from Vout to Vin. Active rectifier 12-1 can be designed so as to always draw only a few nanoamperes from the current sources circuits in block 18. The amount of current consumed by active rectifier 12-1 is provided by four conventional current source circuits that are included in current source circuit 18. There is a trade-off between the current supplied by $V_{DD}$ and the rectifier speed (i.e., and the maximum frequency of the input signal).

Figure 5A:
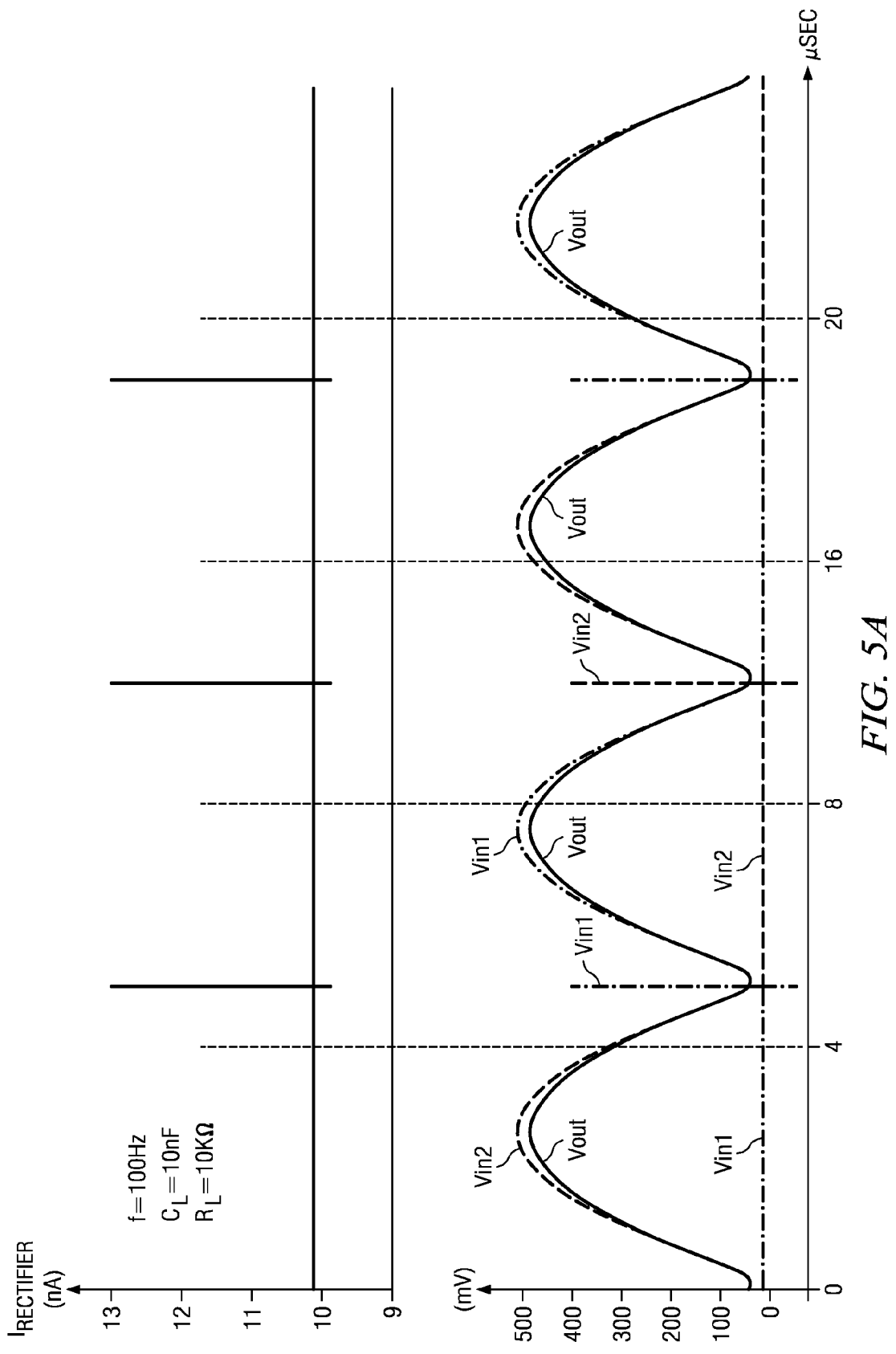
FIGS. 5A-C are graphs of simulated voltage and current signals useful in explaining operation of the active rectifier shown in FIG. 3B.

In FIG. 5A the lower graph includes waveforms of Vin1 and Vin2 at a frequency of 100 Hz and the resulting simulated voltage Vout produced by active rectifier 12-1, for the case in which it is loaded by a 10 nF (nanofarad) capacitor CL and a 10 kilohm resistor RL (not shown in FIG. 3A or 3B but see FIG. 2). That is why the output voltage changes so much. With this loading, Vout follows Vin 1 and Vin2 closely, by approximately the previously described 10 millivolt input offset voltage of amplifiers A1 and A2. There is not a large amount of voltage drop in active rectifier 12-1, and consequently there is not a corresponding large amount of power consumption in active rectifier 12-1. The sharp or vertical portions of the Vin1 and Vin2 curves also show that the switching of transistors M3 and M4 occurs very rapidly. The upper graph in FIG. 5A shows the amount of current consumed by an implementation of rectifier 12-1.

Figure 5B:
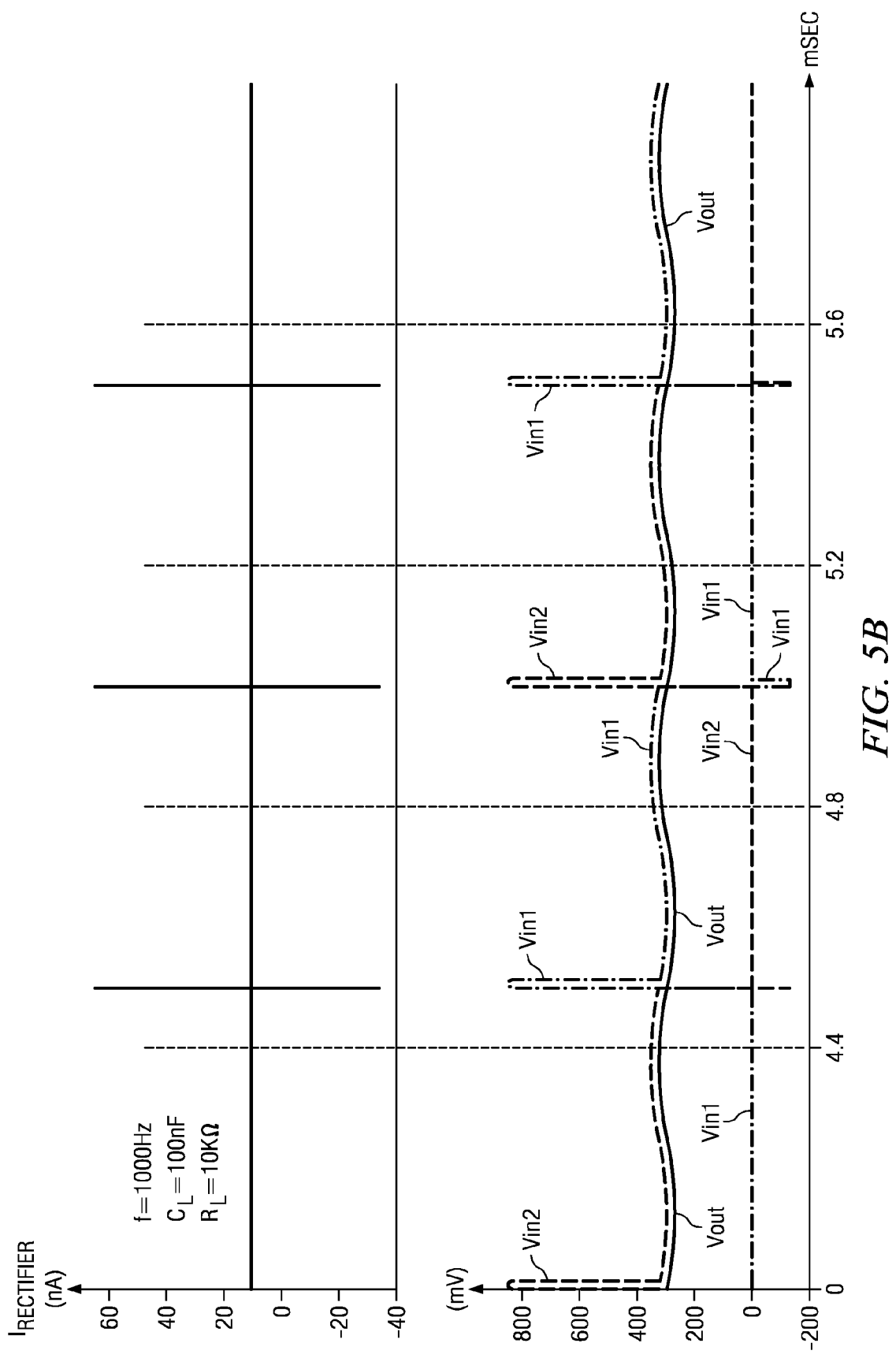

FIG. 5B shows the same simulated voltages and currents for the case in which active rectifier 12-1 is loaded by a much larger 100 nF capacitor, with the frequency of Vin1 and Vin2 being 1000 Hz. Since the load capacitor CL is large, the rectified output voltage Vout does not vary as much as in FIG. 5A and instead is relatively constant at a value of roughly around 300 millivolts. Since the frequency is much higher than in FIG. 5A, the switching of transistors M3 and M4 does not appear as instantaneous in the nearly vertical portions of the Vin1 and Vin2 waveforms in FIG. 5B. However, most of the time the rectified output Vout closely follows Vin1 and Vin2 by approximately the roughly 10 millivolt built-in input offset voltage of feedback amplifiers A1 and A2.

Figure 5C:
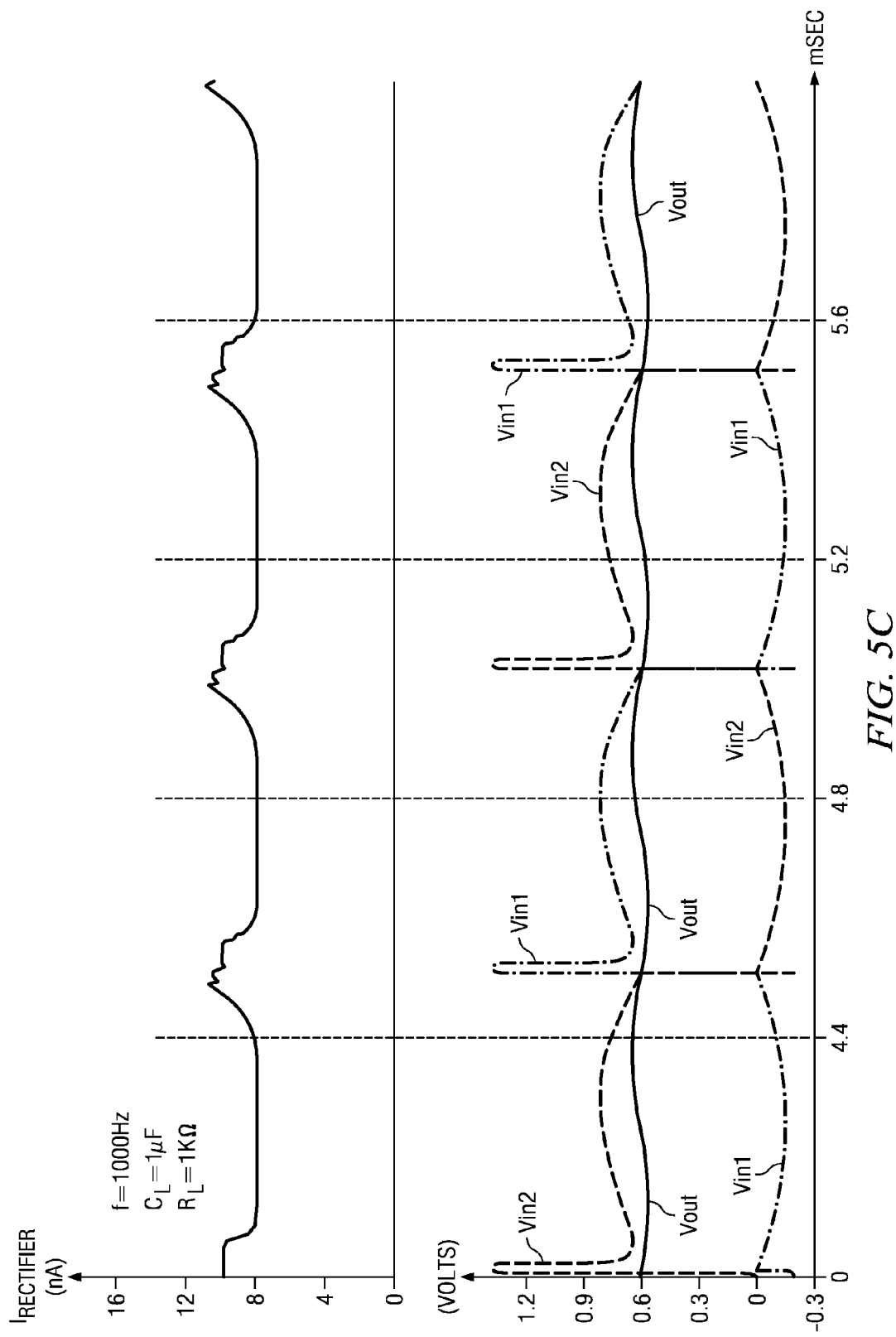

Referring to FIG. 5C, in this case the magnitudes of the harvested input voltages Vin1 and Vin2 and corresponding input currents $I_{in1}$ and $I_{in2}$ are much higher, at roughly 1 milliampere. Consequently, feedback amplifiers A1 and A2 cannot maintain the same built-in offset voltage of roughly 10 millivolts as the voltage drop between Vout and the two input signals Vin1 and Vin2. In this case, the voltage drops across transistors M3 and M4 are determined primarily by their "on" channel resistances. If more output current is needed, the size of the transistors needs to be increased to reduce power consumption. For example, if the amount of current needs to be increased by a factor of 10, current consumption probably will need to be increased by a factor of 4 or 5.

Thus, the present invention provides an active rectifier which operates from very low input voltages, does not require use of hysteresis comparators, and avoids the very high power consumption of the prior art. Furthermore, the rectifying operation remains efficient even for AC signals having very high voltages.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention.

What is claimed is:

1. An active rectifier circuit comprising:
   (a) a first transistor having a first current-carrying electrode coupled by a first input conductor to a first input voltage and a second current-carrying electrode coupled to an output conductor for conducting a rectified output voltage, and a second transistor having a first current-carrying electrode coupled by a second input conductor to a second input voltage and a second current-carrying electrode coupled to the output conductor;
   (b) a first amplifier having a first input coupled to the first input conductor, a second input coupled to the output conductor, and an output coupled to a gate of the first transistor, and a second amplifier having a first input coupled to the second input conductor, a second input coupled to the output conductor, and an output coupled to a gate of the second transistor;
   (c) a third transistor having a first current-carrying electrode coupled to a first reference voltage, a second current-carrying electrode coupled to the first input conductor, and a gate coupled to the output of the second amplifier, and a fourth transistor having a first current-carrying electrode coupled to the first reference voltage, a second current-carrying electrode coupled to the second input conductor, and a gate coupled to the output of the first amplifier; and
   (d) the first and second amplifiers each having an input offset voltage to limit or prevent backflow of current from the output conductor to either of the first and second input conductors when either of the first and second input voltages, respectively, is nearly equal to the output voltage.

2. The active rectifier circuit of claim 1 wherein each of the first current-carrying electrodes can be either a source or a drain, depending on operation of the active rectifier circuit, and wherein each of the second current-carrying electrodes can be either a source or a drain, depending on operation of the active rectifier circuit.

3. The active rectifier circuit of claim 1 wherein the input offset voltage of each of the first and second amplifiers has a magnitude of approximately +5 to +10 millivolts to cause the first and/or second input voltage to exceed the output voltage output during operation of the active rectifier circuit.

4. The active rectifier circuit of claim 3 wherein the first amplifier operates to maintain a difference between the first input voltage and the output voltage equal to the input offset voltage of the first amplifier, and wherein the second amplifier operates to maintain a difference between the second input voltage and the output voltage equal to the input offset voltage of the second amplifier.

5. The active rectifier circuit of claim 1, wherein the first and second input voltages are AC voltages and wherein each can have an amplitude as low as approximately 200 millivolts.

6. The active rectifier circuit of claim 1 wherein the first amplifier includes first and second input transistors having sources coupled to the first input conductor and the output conductor, respectively, drains coupled to corresponding current sources, respectively, and gates connected to the drain of the second input transistor, and wherein the second amplifier includes third and fourth input transistors having sources coupled to the second input conductor and the output conductor, respectively, drains coupled to corresponding current sources, respectively, and gates connected to the drain of the fourth input transistor.

7. The active rectifier circuit of claim 1 wherein the first, second, third, and fourth transistors are N-channel transistors.

8. The active rectifier circuit of claim 1 wherein the first and second transistors are P-channel transistors.

9. The active rectifier circuit of claim 6 including first and second passive rectifier circuits for rectifying the first and second input voltages, respectively, under low supply voltage conditions wherein the first and second amplifiers are inoperable.

10. The active rectifier circuit of claim 6 wherein the frequency of the first and second input voltages is in the range from 0 to approximately 2000 Herz.

11. The active rectifier circuit of claim 6 wherein the first and second input voltages have magnitudes that are substantially less than a second reference voltage which supplies power to the first and second amplifiers.

12. The active rectifier circuit of claim 11 wherein the first and second input voltages can have magnitudes that are substantially greater than the second reference voltage.

13. The active rectifier circuit of claim 1 including
   (1) a fifth transistor having a first current-carrying electrode coupled to the first input conductor and a second current-carrying electrode coupled to the output conductor, and a sixth transistor having a first current-carrying electrode coupled to the second input conductor and a second current-carrying electrode coupled to the output conductor;
   (2) a third amplifier having a first input coupled to the output conductor, a second input coupled to the first input conductor, and an output coupled to a gate of the fifth transistor, and a fourth amplifier having a first input coupled to the output conductor, a second input coupled to the second input conductor, and an output coupled to a gate of the sixth transistor.

14. The active rectifier circuit of claim 1 wherein the input offset voltages are internal built-in input offset voltages of the first and second amplifiers, respectively.

15. A method for rectifying a low voltage AC input signal that is equal to a first input voltage minus a second input voltage to produce a rectified output voltage, the method comprising:
   (a) coupling the first input voltage to a first current-carrying electrode of a first transistor having a second current-carrying electrode coupled to an output conductor for conducting the rectified output voltage, and coupling the second input voltage to a first current-carrying electrode of a second transistor having a second current-carrying electrode coupled to the output conductor;
   (b) controlling a first voltage on a gate of the first transistor by means of a first amplifier to maintain a predetermined offset voltage of the first amplifier between the first input voltage and the rectified output voltage while the first input voltage exceeds the rectified output voltage, and controlling a second voltage on a gate of the second transistor by means of a second amplifier to maintain a predetermined offset voltage of the second amplifier between the second input voltage and the rectified output voltage while the first input voltage exceeds the rectified output voltage;
   (c) the predetermined offset voltages limiting or preventing backflow of current from either of the second current-carrying electrodes to a corresponding first current-carrying electrode when either of the first and second input voltages, respectively, is nearly equal to the rectified output voltage.

16. The method of claim 15 including coupling a first current-carrying electrode of a third transistor to a first reference voltage, coupling a second current-carrying electrode of the third transistor to the first current-carrying electrode of the first transistor, and coupling a gate of the third transistor to the gate of the second transistor, and coupling a first current-carrying electrode of a fourth transistor to the first reference voltage, coupling a second current-carrying electrode of the fourth transistor to the first current-carrying electrode of the second transistor, and coupling a gate of the fourth transistor to the gate of the first transistor.

17. The method of claim 15 including providing the input offset voltages of the first and second amplifiers equal to approximately +5 to +10 millivolts.

18. The method of claim 15 including operating the first amplifier to maintain a difference between the first input voltage and the output voltage equal to the input offset voltage of the first amplifier, and operating the second amplifier to maintain a difference between the second input voltage and the output voltage equal to the input offset voltage of the second amplifier.

19. The method of claim 15 including operating first and second passive rectifier circuits to rectify the first and second input voltages, respectively, under a low supply voltage condition at which the first and second amplifiers are inoperable.

20. An active rectifier for rectifying a low voltage AC input signal that is equal to a first input voltage minus a second input voltage to produce a rectified output voltage, the method comprising:

(a) means for coupling the first input voltage to a first current-carrying electrode of a first transistor having a second current-carrying electrode coupled to an output conductor for conducting the rectified output voltage, and means for coupling the second input voltage to a first current-carrying electrode of a second transistor having a second current-carrying electrode coupled to the output conductor;

(b) first amplifier means for controlling a first voltage on a gate of the first transistor to maintain a predetermined offset voltage of the first amplifier between the first input voltage and the rectified output voltage while the first input voltage exceeds the rectified output voltage, and second amplifier means for controlling a second voltage on a gate of the second transistor to maintain a predetermined offset voltage of the second amplifier between the second input voltage and the rectified output voltage while the first input voltage exceeds the rectified output voltage;

(c) the predetermined offset voltages limiting or preventing backflow of current from either of the second current-carrying electrodes to a corresponding first current-carrying electrode when either of the first and second input voltages, respectively, is nearly equal to the rectified output voltage.

* * * * *